United States Patent
Kye et al.

(10) Patent No.: US 9,679,809 B1
(45) Date of Patent: Jun. 13, 2017

(54) METHOD OF FORMING SELF ALIGNED CONTINUITY BLOCKS FOR MANDREL AND NON-MANDREL INTERCONNECT LINES

(71) Applicant: GLOBALFOUNDRIES Inc., Grand Cayman (KY)

(72) Inventors: Jongwook Kye, Pleasanton, CA (US); Yan Wang, San Jose, CA (US); Chenchen Wang, Sunnyvale, CA (US); Wenhui Wang, Santa Clara, CA (US); Lei Yuan, Cupertino, CA (US); Jia Zeng, Sunnyvale, CA (US); Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/077,564

(22) Filed: Mar. 22, 2016

(51) Int. Cl.
| | |
|---|---|
| *H01L 21/768* | (2006.01) |
| *H01L 21/311* | (2006.01) |
| *H01L 21/28* | (2006.01) |
| *H01L 45/00* | (2006.01) |

(52) U.S. Cl.
CPC .. *H01L 21/76879* (2013.01); *H01L 21/28141* (2013.01); *H01L 21/31111* (2013.01); *H01L 45/1691* (2013.01)

(58) Field of Classification Search
CPC ......... H01L 21/76879; H01L 21/28141; H01L 45/1691
See application file for complete search history.

(56) References Cited

U.S. PATENT DOCUMENTS

| | | | |
|---|---|---|---|
| 8,298,943 B1 * | 10/2012 | Arnold | H01L 21/0337 438/667 |
| 8,999,848 B2 | 4/2015 | Lee et al. | |
| 9,123,656 B1 | 9/2015 | Hsieh et al. | |
| 2013/0244344 A1 * | 9/2013 | Malmhall | B82Y 10/00 438/3 |
| 2013/0329486 A1 | 12/2013 | Juengling | |
| 2014/0054534 A1 * | 2/2014 | Pellizzer | H01L 45/06 257/4 |

(Continued)

OTHER PUBLICATIONS

U.S. Appl. No. 15/077,384, filed Mar. 22, 2016.
U.S. Appl. No. 15/077,480, filed Mar. 22, 2016.

*Primary Examiner* — Michael Jung
(74) *Attorney, Agent, or Firm* — Heslin Rothenberg Farley & Mesiti P.C.

(57) ABSTRACT

A method of forming a pattern for interconnect lines in an integrated circuit includes providing a structure having a first lithographic stack, a mandrel layer and a pattern layer disposed over a dielectric stack. Patterning the structure to form mandrels in the mandrel layer and disposing a spacer layer over the mandrels. Etching the spacer layer to form spacers disposed on sidewalls of the mandrels. The spacers and mandrels defining beta and gamma regions. A beta region includes a beta block mask portion and a gamma region includes a gamma block mask portion of the pattern layer. The method also includes etching a beta pillar over the beta block mask portion and etching a gamma pillar over the gamma block mask portion. The method also includes etching the structure to form a pattern in the pattern layer, the pattern including the gamma and beta block mask portions.

15 Claims, 15 Drawing Sheets

(56) References Cited

U.S. PATENT DOCUMENTS

| | | | |
|---|---|---|---|
| 2014/0170853 A1* | 6/2014 | Shamma | H01L 21/02115 438/699 |
| 2014/0273464 A1* | 9/2014 | Shieh | H01L 21/823431 438/700 |
| 2015/0140811 A1* | 5/2015 | Huang | H01L 21/3086 438/669 |
| 2015/0318173 A1* | 11/2015 | Shih | H01L 21/0338 438/702 |
| 2016/0049307 A1* | 2/2016 | Chen | H01L 21/0337 438/696 |
| 2016/0056075 A1 | 2/2016 | Wei et al. | |
| 2016/0056104 A1 | 2/2016 | Bouche et al. | |

\* cited by examiner

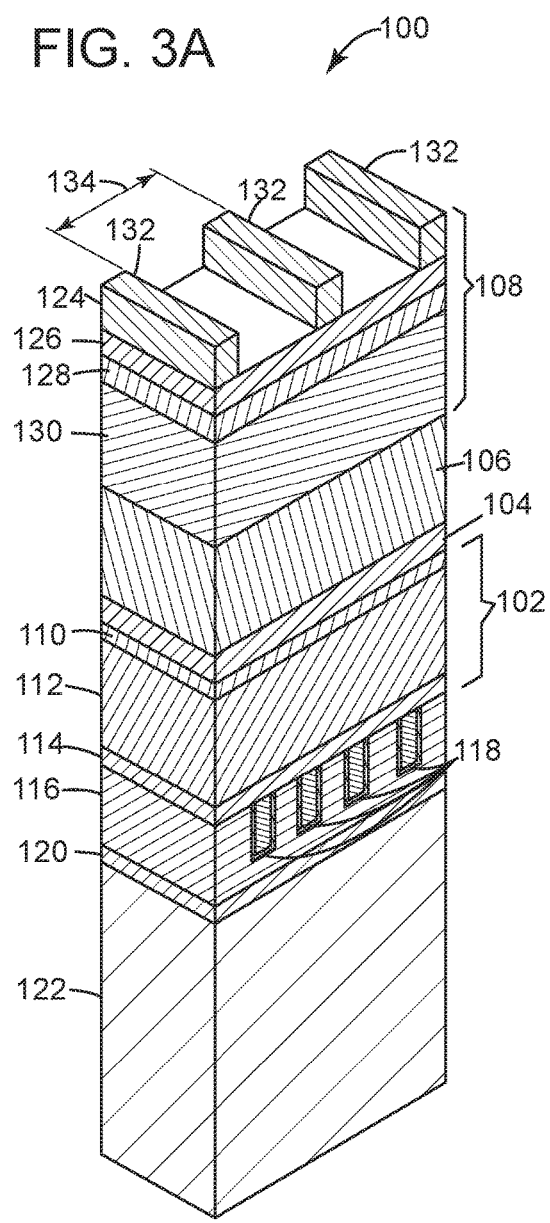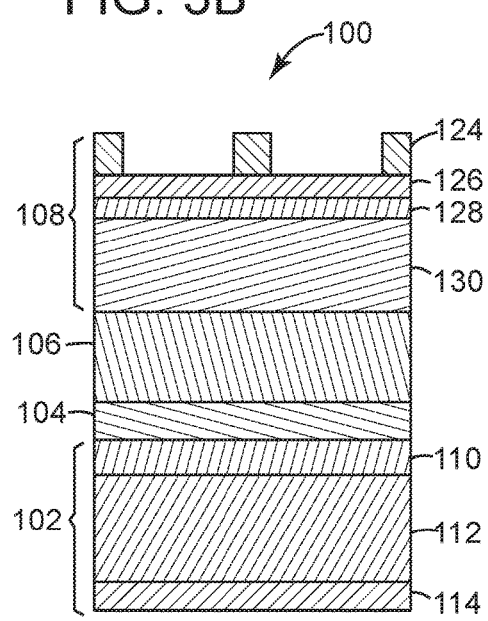

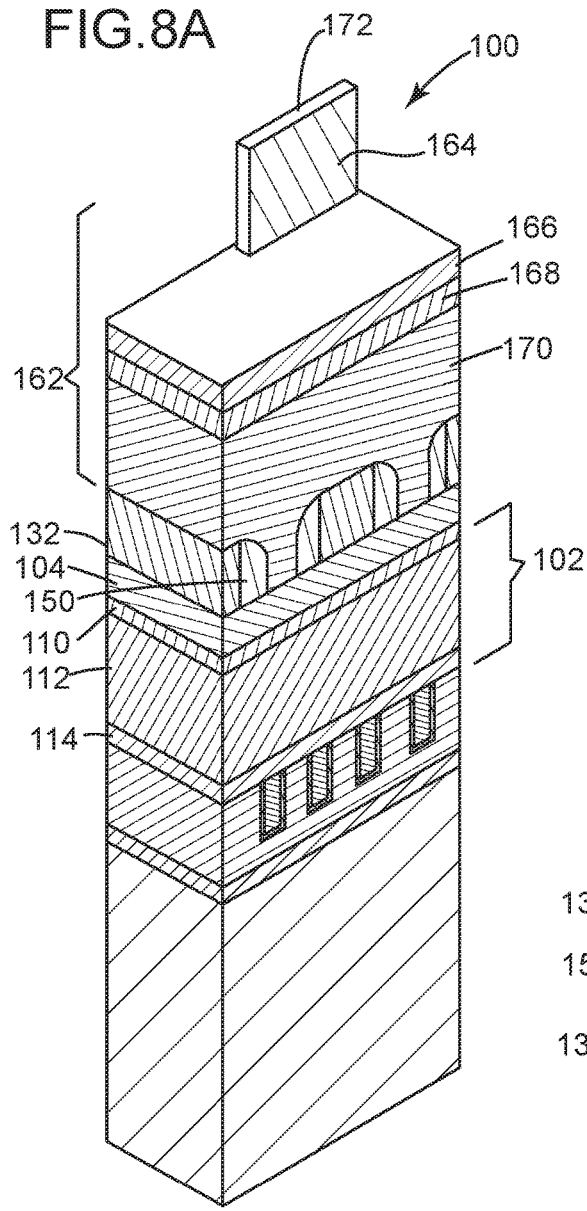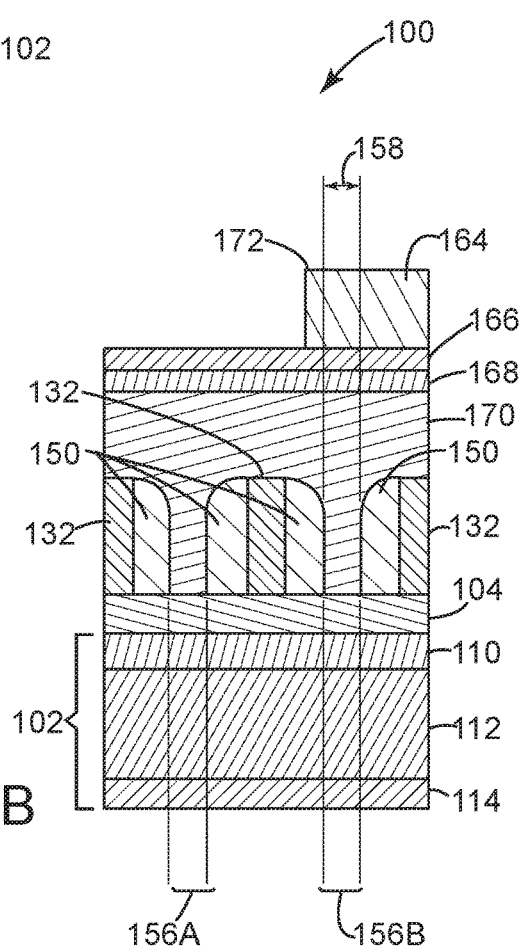

US 9,679,809 B1

METHOD OF FORMING SELF ALIGNED CONTINUITY BLOCKS FOR MANDREL AND NON-MANDREL INTERCONNECT LINES

TECHNICAL FIELD

The present invention relates to semiconductor devices and methods of fabricating the same. More specifically, the invention relates to various methods of forming patterns for electrical interconnection systems in integrated circuits.

BACKGROUND

With constant down-scaling and increasingly demanding requirements to the speed and functionality of ultra-high density integrated circuits, semiconductor devices, such as transistors, diodes, capacitors and the like, need ever more complex and densely packaged electrical interconnection systems between devices. The conventional process of manufacturing such interconnection systems has been to use a series of lithographic processes to pattern and dispose metal interconnection lines and vias on a dielectric layer to form a metallization layer. The metallization layer would be disposed above a substrate having active semiconductor devices embedded therein and the interconnection system would provide the contacts and interconnections between those devices.

Previously, the lithography process was carried out on a two-dimensional (2D) scale, that is, on a single metallization layer, wherein geometrically complex patterns were disposed on one level to form the interconnections between devices. However, at about a pitch of 90 nanometers (nm), the resolution of current lithographic processes becomes blurred enough to make such complex patterning unreliable. This is especially the case in the first two metallization layers (M1 and M2) where metallization is the densest.

Therefore, as illustrated in exemplary prior art FIG. 1, at lower technology class sizes, such as the 10 nm class size or when the repetitive pitch distance is no greater than 40 nm, self-aligned double patterning (SADP) processes are now used to provide an interconnection system 10 which includes multiple levels of arrays of parallel pairs of straight metalized trenches (or interconnect lines) 12 and 14 disposed in dielectric layers 16. The array of interconnect lines 12 and 14 of each dielectric layer 16 are often oriented at 90 degree angles relative to the arrays of the adjacent dielectric layers (not shown). The multiple dielectric layers are connected with a system of vias, such that, once the trenches and vias are metallized, there is electrical continuity between levels of the interconnection system 10.

In order to provide device functionality, a plurality of non-aligned dielectric blocks 18 and 20, which block the electric continuity of neighboring interconnection lines 12 and 14, are patterned into the dielectric layer at specific locations to direct current flow between the dielectric layers 16 and devices. The blocks 18 and 20 are patterned into the dielectric layer 16 through a series of lithographic processes. In the exemplary ideal case, as shown in FIG. 1, the lithographic processes are perfectly aligned such that block 18 interrupts the precise active interconnect line 12 it is associated with, without extending into any neighboring interconnect line 14. Additionally block 20 interrupts its interconnect line 14 without extending into any neighboring line 12.

Problematically, lithographic misalignment, or overlay, is a significant issue at lower technology node sizes, such as when the technology class size is no greater than 10 nm or when the repetitive pitch distance is no greater than 40 nm. Overlay is a measure of how well two lithographic layers (or steps) align. Overlay can be in the X or Y direction and is expressed in units of length.

In mass production, the lithographically disposed dielectric blocks 18 and 20 must be large enough to make sure that they always cut the active line they are supposed to (i.e., lines 12 and 14 respectively) without clipping any neighboring lines, taking into account the overlay control for the worst 3 sigma case. In an exemplary worst 3 sigma case scenario, as shown in prior art FIG. 2, for at least the 10 nm class or less or for a pitch of 40 nm or less, the current state of the art 3 sigma overlay control is not precise enough to prevent dielectric blocks 18 and 20 from over-extending into active neighboring lines in an acceptably few number of cases. That is, the failure rate of blocks 18 extending into adjacent lines 14 and blocks 20 extending into adjacent lines 12 will be outside of the industry acceptable 3 sigma standard.

The unwanted over-extension of blocks 18 (which are supposed to cut lines 12 only) into neighboring lines 14, and over-extension of blocks 20 (associated with lines 14) into neighboring lines 12 can, in the worst case condition, completely interrupt electrical continuity in the wrong line. Additionally, a line that is inadvertently only partially cut may still conduct for a time, but will over heat and prematurely fail.

Accordingly, there is a need for a method of patterning interconnection lines that is tolerant of lithographic misalignment or overlay. Additionally, there is a need for a method that is capable of patterning dielectric blocks between interconnection lines such that the blocks do not clip neighboring lines.

BRIEF DESCRIPTION

The present invention offers advantages and alternatives over the prior art by providing a method that is capable of forming a pattern for interconnection lines and associated continuity dielectric blocks in an integrated circuit. The pattern includes alternating beta and gamma regions for forming beta and gamma interconnect lines. The pattern also includes at least one beta block mask portion for forming a continuity beta dielectric block across a beta line, wherein the beta dielectric block does not extend into a gamma line. The pattern further includes at least one gamma block mask portion for forming a continuity gamma dielectric block across a gamma line, wherein the gamma dielectric block does not extend into a beta line.

A method of forming a pattern in accordance with one or more aspects of the present invention includes providing a structure having a first lithographic stack, a mandrel layer and a pattern layer disposed over a dielectric stack. Then patterning the structure to form mandrels in the mandrel layer. Next disposing a spacer layer over the mandrels. The spacer layer is etched to form spacers disposed on sidewalls of the mandrels, the spacers and mandrels defining beta and gamma regions extending normally through the dielectric stack. A beta region includes a beta block mask portion and a gamma region includes a gamma block mask portion of the pattern layer. A beta pillar mask is etched over the beta block mask portion, the beta pillar mask does not extend over any adjacent beta regions. A gamma pillar mask is etched over the gamma block mask portion, the gamma pillar mask does not extend over any adjacent gamma regions. The method also includes etching the structure to form a pattern in the pattern layer, the pattern including the gamma and beta block mask portions.

In another exemplary embodiment of the invention, the method includes providing a structure having a mandrel layer disposed over a pattern layer. Then patterning the structure to form mandrels in the mandrel layer. Next disposing a spacer layer over the mandrels. The spacer layer is etched to form spacers disposed on sidewalls of the mandrels. The spacers and mandrels define alternating beta and gamma regions extending normally through the pattern layer. A beta region includes a beta block mask portion and a gamma region includes a gamma block mask portion of the pattern layer. A beta pillar mask is etched over the beta block mask portion. The beta pillar mask does not extend over any adjacent beta regions. A gamma pillar mask is etched over the gamma block mask portion. The gamma pillar mask not extend over any adjacent gamma regions. The method also includes etching the structure to form a pattern in the pattern layer, the pattern including the gamma and beta block mask portions.

DRAWINGS

The invention will be more fully understood from the following detailed description taken in conjunction with the accompanying drawings, in which:

FIG. 3A is simplified perspective view of an exemplary embodiment of a structure for an integrated circuit device having a first lithographic stack disposed over a mandrel layer, the mandrel layer disposed over a pattern layer, and the pattern layer disposed over a dielectric stack in accordance with the present invention;

FIG. 3B is a side view of FIG. 3A;

FIG. 8A is a perspective view of the structure of FIG. 7A having a second lithographic stack disposed thereon;

FIG. 8B is a side view of FIG. 8A;

DETAILED DESCRIPTION

Figure 1:
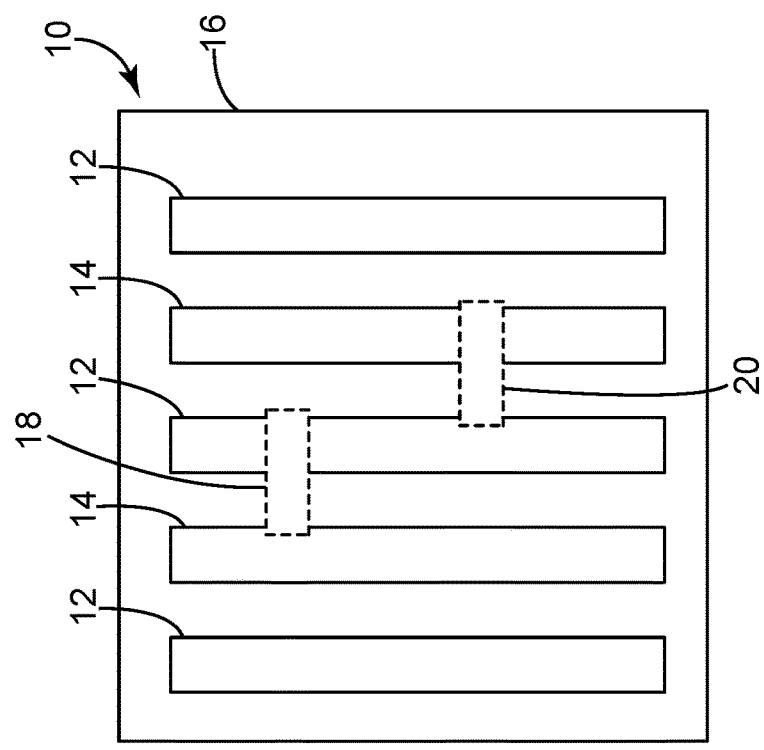
FIG. 1 is a simplified top view of an exemplary embodiment of an ideal case prior art interconnection system with aligned dielectric blocks.
Figure 2:
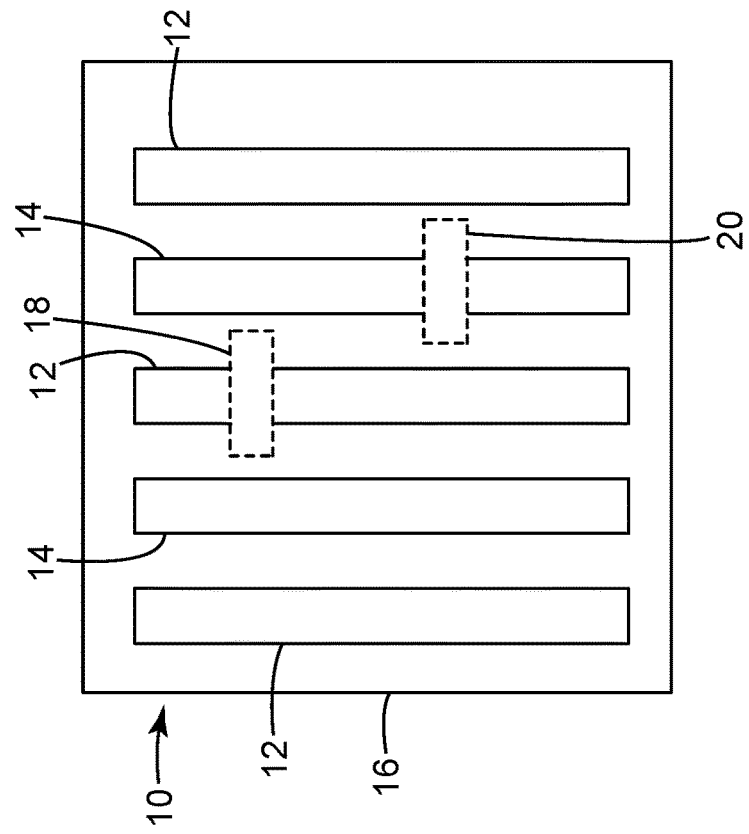
FIG. 2 is a simplified top view of an exemplary embodiment of a worst case prior art interconnection system with misaligned dielectric blocks.

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 3-16 illustrate various exemplary embodiments of methods of forming patterns for interconnection lines and associated continuity blocks for integrated circuits in accordance with the present invention.

Referring to FIGS. 3A and 3B, a simplified view of an exemplary embodiment of a structure 100 for an integrated circuit device in accordance with the present invention is presented at an intermediate stage of manufacturing. Structure 100 includes a dielectric stack 102 upon which a titanium nitride (TiN) pattern layer 104 is disposed, and over the pattern layer 104 is disposed an amorphous silicon (a-Si) mandrel layer 106. Structure 100 also includes a first lithographic stack 108 disposed over the mandrel layer 106.

The dielectric stack 102 may include many different combinations of stacks of layers depending on such factors as application requirements, cost, design preferences and the like. In this exemplary embodiment, the dielectric stack 102 includes a first silicon oxynitride dielectric layer (first SiON dielectric layer) 110 disposed over an ultra-low dielectric constant (ULK) layer 112, such as a dielectric layer composed of various combinations of silicon, carbon, oxygen and hydrogen (an SiCOH layer).

The ULK layer 112 is disposed over an etch-stop layer 114, which is also included in the dielectric stack 102. The etch-stop layer 114, in this embodiment, is a dielectric layer composed of various combinations of silicon, carbon and nitrogen (a SiCN) layer.

The dielectric stack 102 is disposed over a metallization layer 116, which contains a plurality of interconnect lines 118 that make up a portion of an electrical interconnection system for structure 100. Metallization layer 116, in turn, is disposed over a second etch stop layer 120. The second etch stop layer 120 is disposed over a complex stack of buried layers 122 from the substrate (not shown) upwards.

The lithographic stack 108 can be composed of several different kinds of layers, depending on such parameters as the application requirements, design or proprietary preferences or the like. One such stack of layers includes a stack of four thin films which includes (from top to bottom) a resist layer 124, a bottom antireflective coating (BARC) layer 126, a second SiON dielectric layer 128 and a spin-on hardmask (SOH) layer 130. The composition of SOH is typically amorphous carbon, and the deposition of it using a spin-on method makes the film self-planarizing.

Once the stack 108 is disposed over the mandrel layer 106, an array of parallel mandrels 132 are patterned into the resist layer 124 of the lithographic stack 108 through well-known lithographic techniques. Note that in this exemplary embodiment, a pitch 134 (i.e., the center to center distance between repetitive features on an integrated circuit) between mandrels is set at 80 nm.

The function of the mandrel layer 106 disposed over the pattern layer 104 is to isolate distinct geometric features which can be formed into the separated layers 104, 106 in a series of processes. The features can ultimately be processed to be combined into the pattern layer 104 to form a pattern 136, as best illustrated in FIG. 4.

Figure 4:
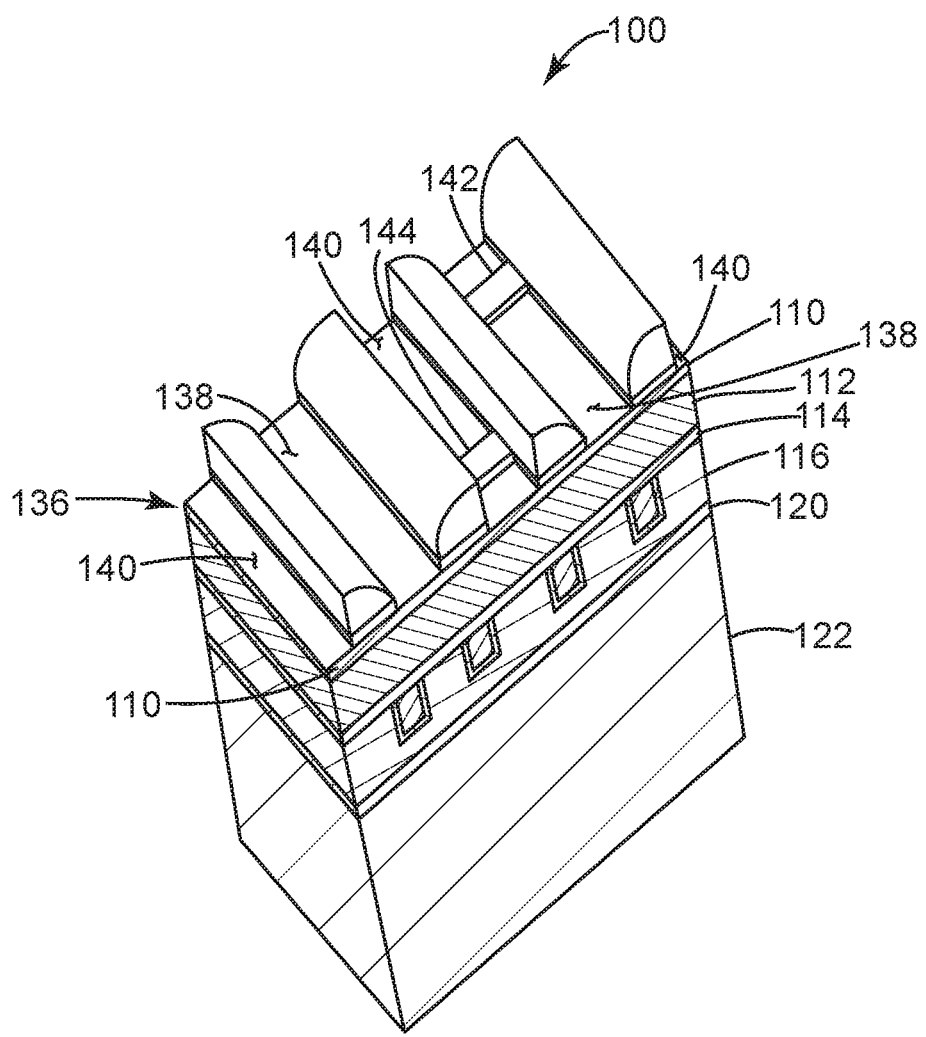
FIG. 4 is simplified perspective view of an exemplary embodiment of a pattern for an interconnection system in accordance with the present invention.

Referring to FIG. 4, as will be discussed in greater detail herein, the pattern 136 will be used to etch an array of parallel trenches into the ULK layer 112 of the dielectric stack 102, which will later be metalized to form interconnect lines that are at least a portion of the electrical interconnection system of structure 100. More specifically, pattern 136 defines locations of non-mandrel (or gamma) interconnect lines 138 disposed in gamma regions of the ULK layer 112. Additionally, the pattern 136 defines locations of mandrel (or beta) interconnect lines 140 disposed in beta regions of the ULK layer 112. The gamma and beta regions are disposed such that they alternate between each other.

The pattern 136 includes certain gamma (non-mandrel) block mask portions 142, that define locations of gamma blocks in the ULK layer 112, which block electrical continuity of the gamma interconnect lines. The gamma blocks 142 extend across the entire width of a gamma region but do not extend into any adjacent beta regions where they can cut a beta interconnect line. The pattern 136 also includes beta block mask portions 144, that define locations of beta blocks in the ULK layer 112, which block electrical continuity of beta interconnect lines. The beta blocks 144 extend across the entire width of a beta region but do not extend into any adjacent gamma regions where they can cut a gamma interconnect line.

Figure 5A:
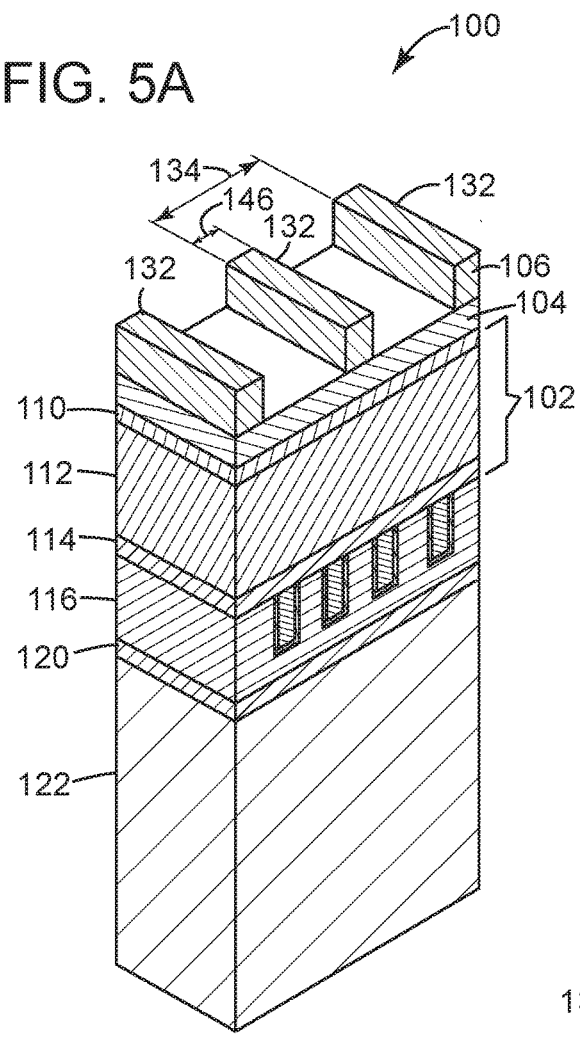
FIG. 5A is a perspective view of an exemplary embodiment of the structure of FIG. 3A having the mandrels patterned into the mandrel layer.
Figure 5B:
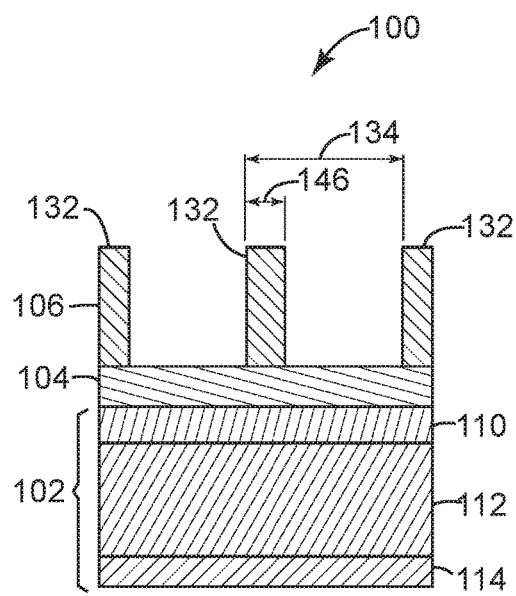
FIG. 5B is a side view of FIG. 5A.

Referring to FIGS. 5A and 5B, the mandrels 132 in the resist layer 124 are then etched and trimmed, by a variety of well-known processes, to reduce the width (indicated by arrow 146) of the mandrels 132 to, in this example, substantially 20 nm and to extend the mandrels down to the mandrel layer 106. It is important to note that even though the width 146 of the mandrels 132 has been reduced to 20 nm, the pitch 134 of 80 nm has not changed.

It is also important to note that the mandrel layer 106 (and therefore the mandrels 132) and the pattern layer 104 have different material compositions in order to be able to selectively etch features into each in the following steps. In this particular exemplary embodiment, titanium nitride (TiN) was chosen for the material of the pattern layer 104 and amorphous silicon (a-Si) was chosen for the material of the mandrels 132. However, one skilled in the art would recognize that many other materials can be used. What is necessary is that the material for the pattern layer 104 be different enough from the material of the mandrels 132 such that the two materials will have different etch rates for different etch processes. More preferably, the materials should be different enough such that the pattern layer 104 is readily etched and the mandrels 132 are not etched at all by a first etch process, while the mandrels 132 are readily etched and the pattern layer 104 is not etched at all for a different second etch process. In this manner, the mandrels 132 and pattern layer 104 can be selectively etched in the various remaining steps.

Figure 6A:
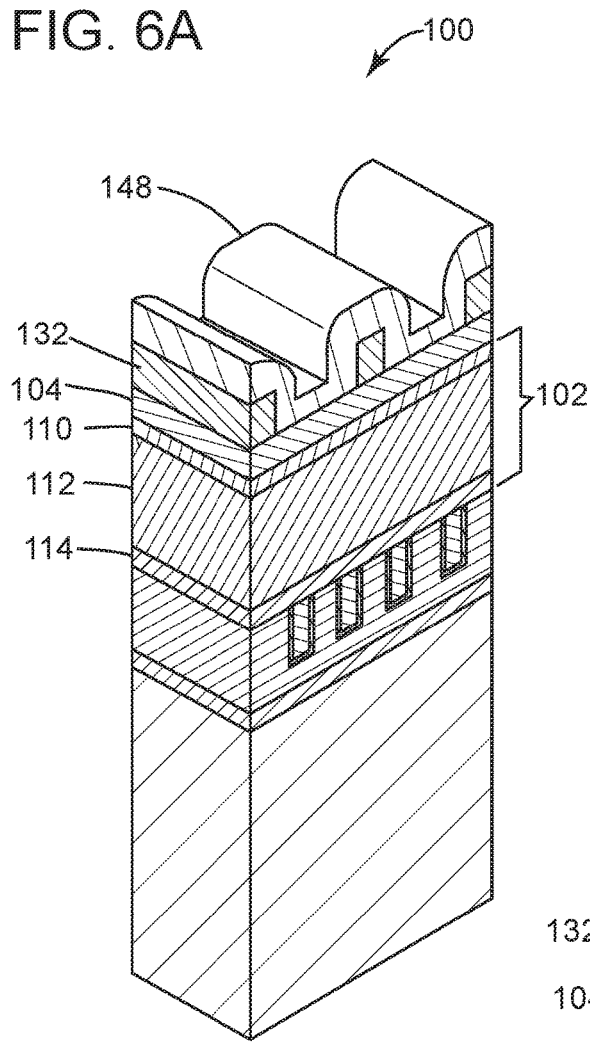
FIG. 6A is a perspective view of an exemplary embodiment of the structure of FIG. 5A having a spacer layer disposed over the mandrels.
Figure 6B:
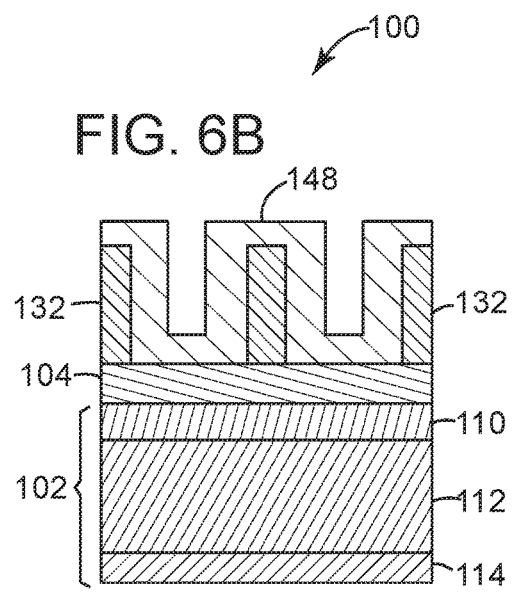
FIG. 6B is a side view of FIG. 6A.

Referring to FIGS. 6A and 6B, a spacer layer 148 is disposed over the structure 100. The spacer layer 148, in this example, is a silicon dioxide (SiO2) thin film, which is conformally coated over the mandrels 132 (and therefore the mandrel layer 106) and exposed pattern layer 104. The SiO2 material composition of the spacer layer 148 was chosen to be different from that of the mandrels 132 (and therefore the mandrel layer 106) and pattern layer 104. Other materials for the spacer layer 148 may also be used. However, it is highly desirable that the material composition of the spacer layer 148 be different enough to enable selective etching between any combination of the mandrels 132, the pattern layer 104 and the spacer layer 148.

The spacer layer 148 can be applied by a deposition process, such as an atomic layer deposition (ALD) process, which can precisely control the film thickness. In this embodiment, the film thickness is controlled to substantially 20 nm.

Figure 7A:
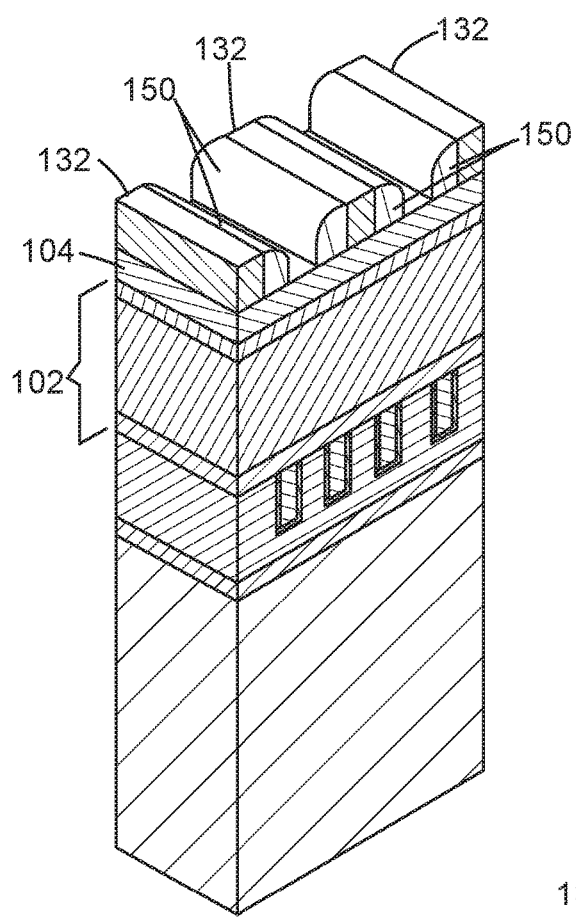
FIG. 7A is a perspective view of the structure of FIG. 6A having the spacer layer anisotropically etched to expose a top surface of the mandrels in accordance with the present invention.
Figure 7B:
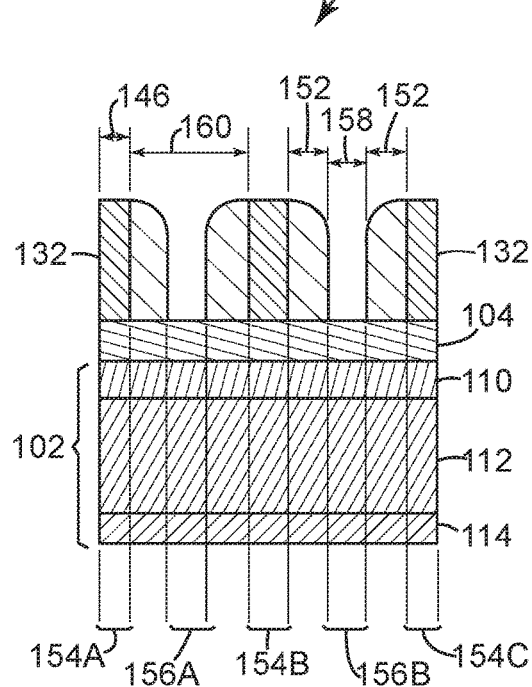
FIG. 7B is a side view of FIG. 7A.

Referring to FIGS. 7A and 7B, the spacer layer 148 is anisotropically etched, such as by a RIE process, to expose a portion of the top surface of the pattern layer 104 and to expose the upper surface of the mandrels 132. Further the anisotropic etching process forms an array of spacers 150 disposed on sidewalls of the mandrels 132. Since the anisotropic etching process etches substantially in the vertical direction only, the remaining spacers have a width 152 that is substantially equal to the original spacer layer thickness of 20 nm.

It is important to note that prior art methods of interconnect line fabrication typically remove the mandrels 132 at this stage of the process flow, effectively cutting the pitch distance in half (from 80 nm to 40 nm in this example). As will be explained in greater detail herein, it is advantageous for the present invention to leave the mandrels 132 intact until later in the process flow.

As best seen in FIG. 7B, the spacers 150 and mandrels 132 define beta regions (also referred to herein as "mandrel regions") 154A, 154B, 154C, which alternate between gamma regions (also referred to herein as "non-mandrel regions") 156A, 156B. The beta and gamma regions extend normally (perpendicularly) through the entire structure 100, including the dielectric stack 102. The beta region 154 B includes the beta block mask portion 144 of the pattern 136 in the pattern layer 104 (best seen in FIG. 4). The gamma region 156B includes the gamma block mask portion 142 of the pattern 136 in the pattern layer 104 (best seen in FIG. 4).

More specifically, the beta regions 154A, B, C extend through the mandrels 132 and have a width, which is equal to the mandrel width 146. The beta regions 154A, B, C extend through and define the locations 140 of beta (or mandrel) interconnect lines in pattern 136 (best seen in FIG. 4). In this particular example, since the mandrels 132 have a set width of 20 nm, the beta regions (and the mandrel interconnect lines within the beta regions) will also have a width of 20 nm.

Also more specifically, the gamma regions 156A, B extend through the exposed portions of the pattern layer 104 which are absent any overlaying spacers 150 or mandrels 132. The gamma regions 156A, B extend through and define the locations 138 of gamma (or non-mandrel) interconnect lines in pattern 136 (best seen in FIG. 4).

The gamma regions 156A, B have a width 158, which is equal to the distance 160 between the mandrels 132 minus twice the spacer width 152. In this exemplary embodiment, since the pitch is 80 nm and the mandrels are 20 nm, then the distance 160 between mandrels is 60 nm (80 nm pitch minus 20 nm mandrel width). Also, since the spacer width 152 has been controlled to 20 nm, the gamma region width 158 (and the non-mandrel interconnection lines within the gamma regions) is also 20 nm (60 nm distance between mandrels minus twice the 20 nm spacer width).

Though this exemplary embodiment illustrates three beta regions 154A, B, C and two gamma regions 156A, B, any number of beta or gamma regions may be patterned into this process flow. Additionally, though this example is illustrating a beta (mandrel) region width 146 of 20 nm and a gamma (non-mandrel) region width of 20 nm, one skilled in the art would recognize that any width may be chosen for beta and gamma region widths. Further the widths may also vary from beta region to beta region or from gamma region to gamma region on the same integrated circuit structure.

Referring to FIGS. 8A and 8B, a second lithographic stack 162 is disposed over the structure 100. The lithographic stack 162 is again composed of (from top to bottom) a resist layer 164, a BARC layer 166, a SiON dielectric layer 168 and an SOH layer 170. A gamma pillar mask (or gamma pillar) 172 is then patterned into a predetermined location of resist layer 164 of the stack 162. More specifically, the gamma pillar mask 172 is centrally disposed over the entire width of 158 gamma region 156B for the purpose of forming gamma block mask portion 142 (best seen in FIG. 4).

Figure 9A:
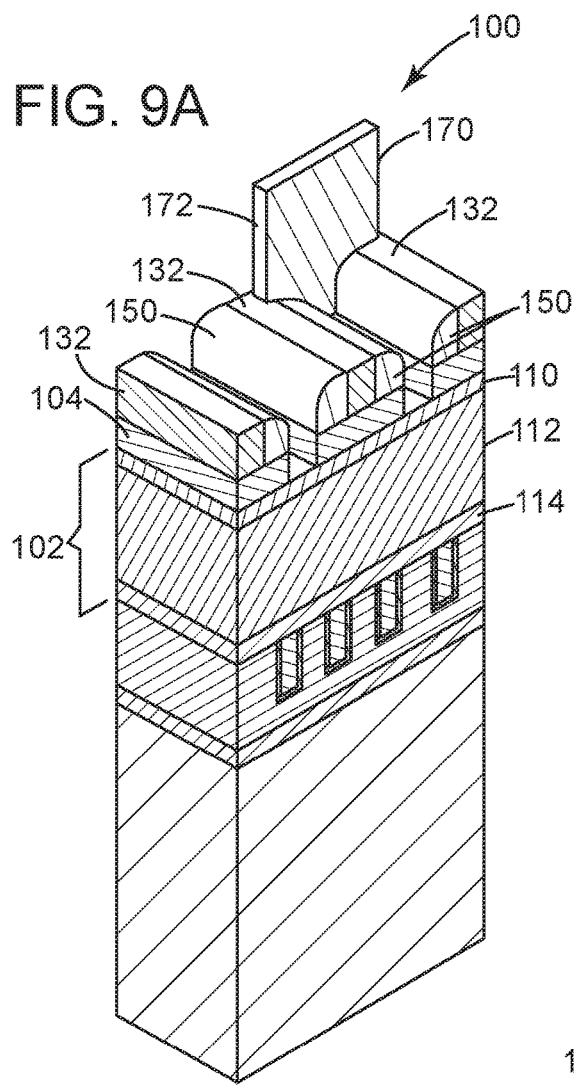
FIG. 9A is a perspective view of the structure of FIG. 8A having a gamma pillar mask disposed thereon.
Figure 9B:
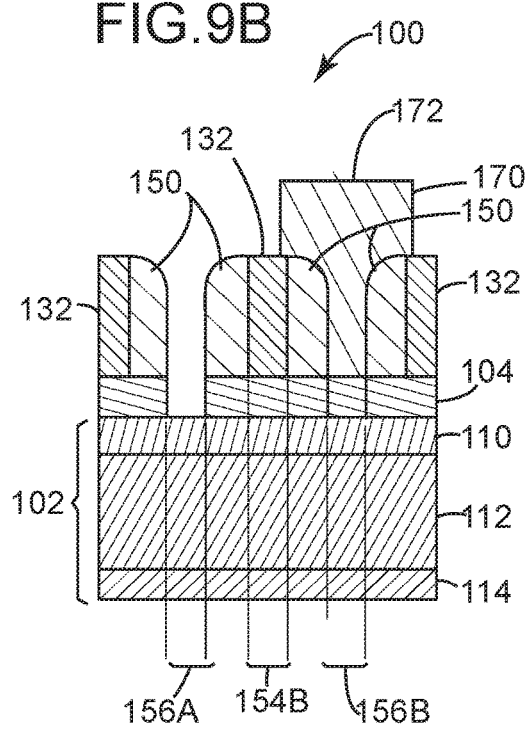
FIG. 9B is a side view of FIG. 9A.

Referring to FIGS. 9 A and B, an anisotropic etch process, such as a RIE etch process, is then utilized to selectively etch gamma pillar 172 into the SOH layer 170 such that it is disposed entirely over the gamma block mask portion 142 (best seen in FIG. 4) of pattern layer 104 in beta region 156B. Additionally, the etch process exposes the pattern layer 104 in the other gamma regions (in this exemplary case gamma region 156A), which are not covered by gamma pillar 172.

The gamma block mask portion 142 will ultimately be utilized to form an electrical continuity dielectric block (a gamma block) to a gamma (non-mandrel) interconnect line in the ULK layer 112 of dielectric stack 102. Note that, in this example, the interconnect lines are to be substantially 20 nm in width. Therefore as discussed previously, it is critical that the gamma pillar 172 be precisely located such that its leading edges do not over extend into neighboring exposed interconnect lines. In conventional prior art process flows where the mandrels 132 have already been removed, the gamma pillar 172 would be over extending if its leading edge reached into the adjacent exposed beta region 154B. Since that over extension distance is the width of a single spacer 150 (a mere 20 nm in this example), it would be very difficult to control and prevent with conventional lithography. Under those circumstances the gamma pillar 172 would form a gamma block that would inadvertently clip a beta interconnect line.

Advantageously however, in this present invention, the mandrels 132 have been left intact to protect the adjacent beta region 154B from such over extension of gamma pillar 172. Therefore, rather than having to limit the over extension of gamma pillar 172 to any adjacent beta region, the gamma pillar would not be over extending unless its leading edges reached into an adjacent gamma region (in this case gamma region 156A). This means that the leading edge of gamma pillar 172 would have to extend past the entire mandrel 132 and its associated pair of spacers 150 that protect beta region 154B before the gamma pillar 172 could inadvertently form a gamma block that would clip a gamma interconnect line. Since the mandrels 132 and spacers 150, in this example, have a width of 20 nm each, the distance of the over extension is a full 60 nm, which is well within the overlay control of a conventional state of the art lithographic process.

Once the gamma pillar 172 has been etched into the SOH layer 170, the portions of the TiN pattern layer 104 in the gamma regions 156A, 156B not covered by the gamma pillar 172 are anisotropically etched away. This exposes the gamma interconnect line locations 138 of pattern 136 (best seen in FIG. 4).

Figure 10A:
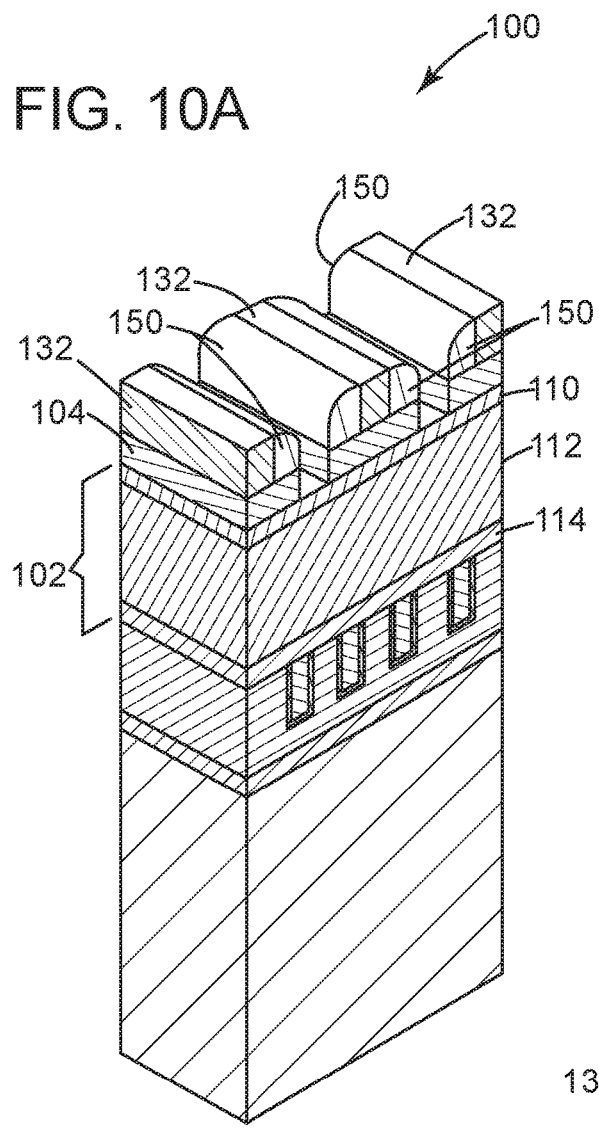
FIG. 10A is a perspective view of the structure of FIG. 9A having the gamma pillar mask removed to expose a gamma block mask portion of the pattern layer.
Figure 10B:
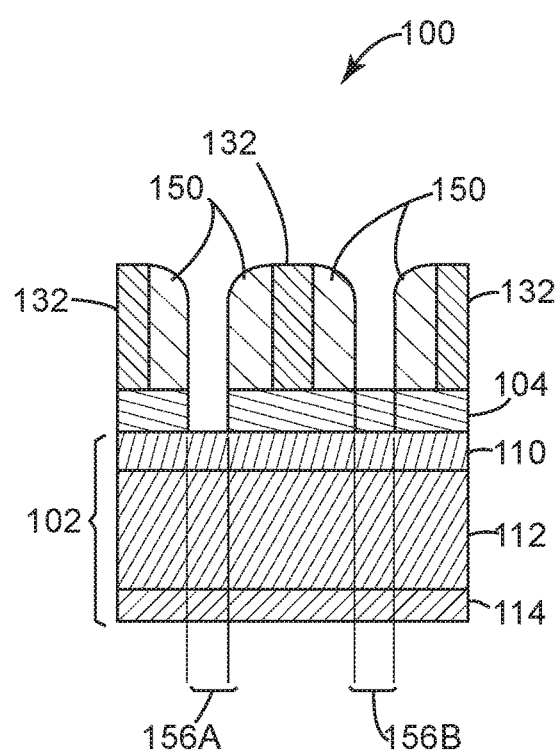
FIG. 10B is a side view of FIG. 10A.

Referring to FIGS. 10A and 10B, the gamma pillar 172 is removed from the structure 100. This exposes the gamma block mask portion 142 of the pattern 136 (best seen in FIG. 4).

Figure 11A:
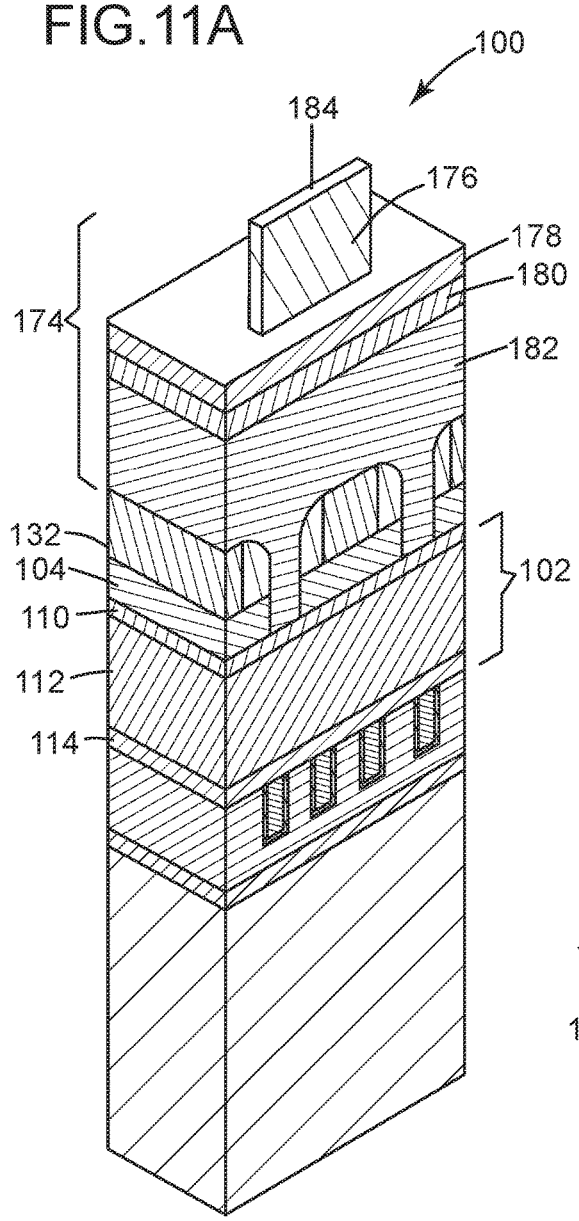
FIG. 11A is a perspective view of the structure of FIG. 10A having a third lithographic stack disposed thereon.
Figure 11B:
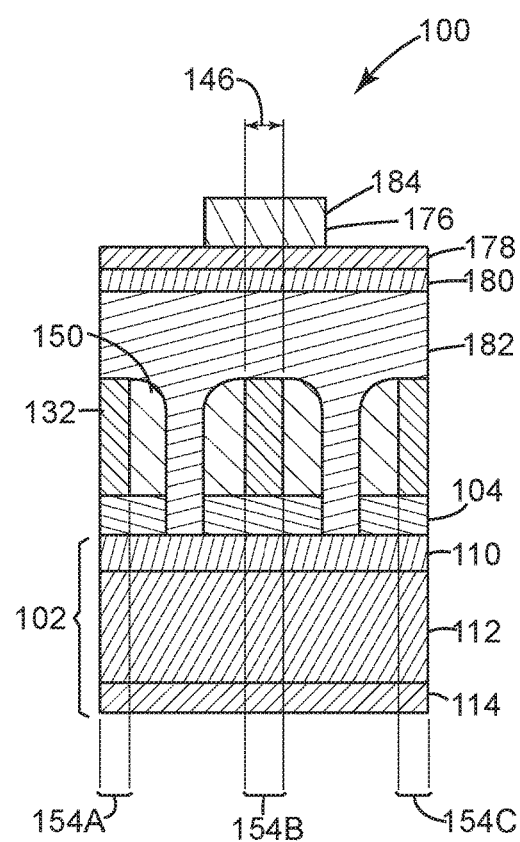
FIG. 11B is a side view of FIG. 11A.

Referring to FIGS. 11A and 11B, a third lithographic stack 174 is disposed over the structure 100. The lithographic stack 174 is again composed of (from top to bottom) a resist layer 176, a BARC layer 178, a SiON dielectric layer 180 and an SOH layer 182. A beta pillar mask (or beta pillar) 184 is then patterned into a predetermined location of resist layer 176 of the stack 174. More specifically, the beta pillar mask 184 is centrally disposed over the entire width 146 of beta region 154B for the purpose of forming beta block mask portion 144 (best seen in FIG. 4).

Figure 12A:
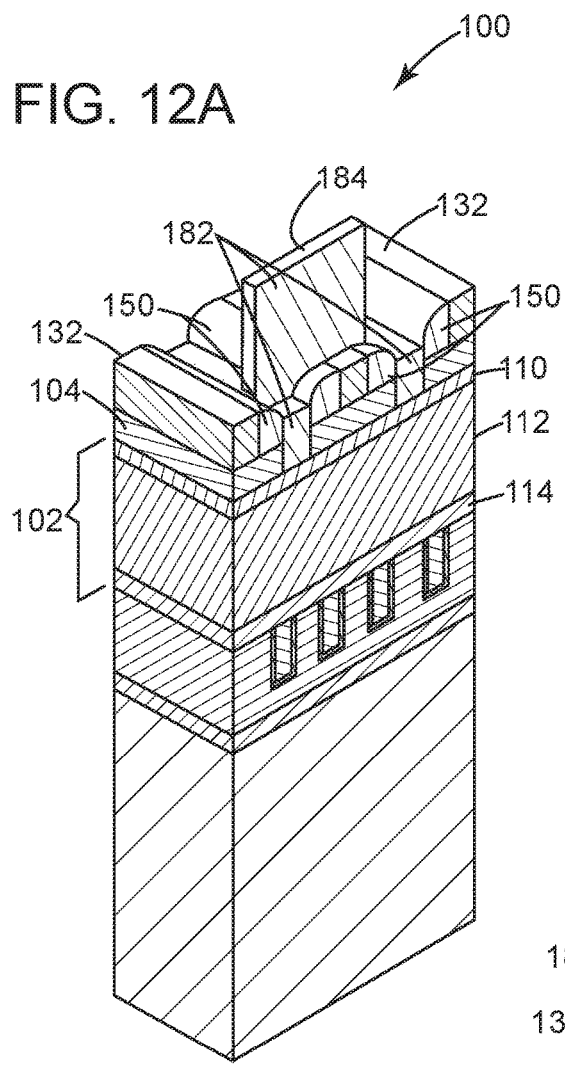
FIG. 12A is a perspective view of the structure of FIG. 11A having a beta pillar mask disposed thereon.
Figure 12B:
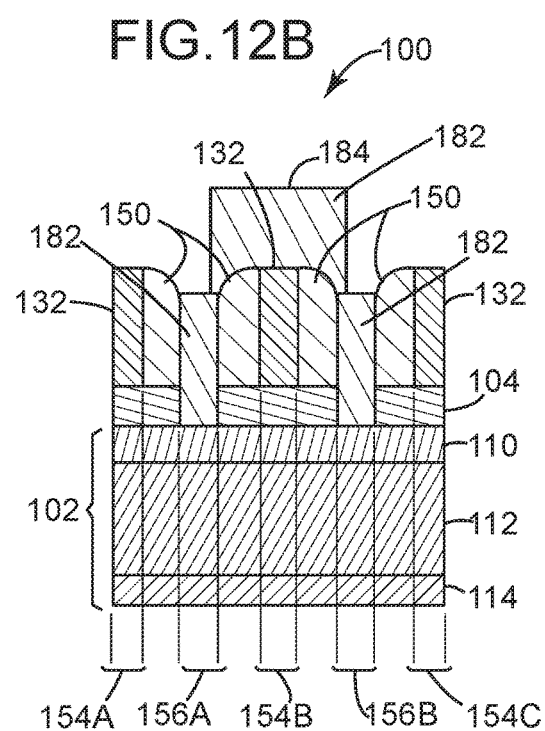
FIG. 12B is a side view of FIG. 12A.

Referring to FIGS. 12A and 12B, an anisotropic etch process, such as a RIE etch process, is then utilized to selectively etch beta pillar 184 into the SOH layer 182. The beta pillar 184 is located such that it is disposed entirely over the mandrel 132 in the beta region 154B, which overlays the beta block mask portion 144 (best seen in FIG. 4) of pattern layer 104.

Additionally, the etch process of the SOH layer 182 is stopped at the point where the top surfaces of the mandrels 132 are exposed, rather than etching the SOH layer 182 all the way to the pattern layer 104. In this way, the gamma regions 156A and 156B are covered and protected by the SOH layer 182, while the beta regions 154A and 154C are exposed for selective etching.

The beta block mask portion 144 will ultimately be utilized to form an electrical continuity dielectric block (a beta block) to a beta (mandrel) interconnect line in the ULK layer 112 of dielectric stack 102. Note that, in this example, the interconnect lines are to be substantially 20 nm in width. Therefore as discussed previously, it is critical that the beta pillar 184 be precisely located such that its leading edges do not over extend into neighboring exposed interconnect lines. In conventional prior art process flows where the SOH layer 182 would have been entirely removed, the beta pillar 184 would be over extending if its leading edge reached into the adjacent exposed gamma regions 156A and 156B. Since that over extension distance is the width of a single spacer 150 (a mere 20 nm in this example), it would be very difficult to control and prevent with conventional lithography. Under those circumstances the beta pillar 184 would form a beta block that would inadvertently clip a gamma interconnect line.

Advantageously however, in this present invention, the portions of the SOH layer 182 which overlays the adjacent gamma regions 156A and 156B have been left intact to protect those gamma regions from such over extension of beta pillar 184. Therefore, rather than having to limit the over extension of beta pillar 184 to any adjacent gamma region, the beta pillar would not be over extending unless its leading edges reached into an adjacent beta region (in this case beta regions 154A and 154C). This means that the leading edge of beta pillar 184 would have to extend past two adjacent spacers 150 and the gamma region they straddle before the beta pillar 184 could inadvertently form a beta block that would clip a beta interconnect line. Since the gamma regions 156A and 156B and spacers 150, in this example, have a width of 20 nm each, the distance of the over extension is a full 60 nm, which is well within the overlay control of a conventional state of the art lithographic process.

Figure 13A:
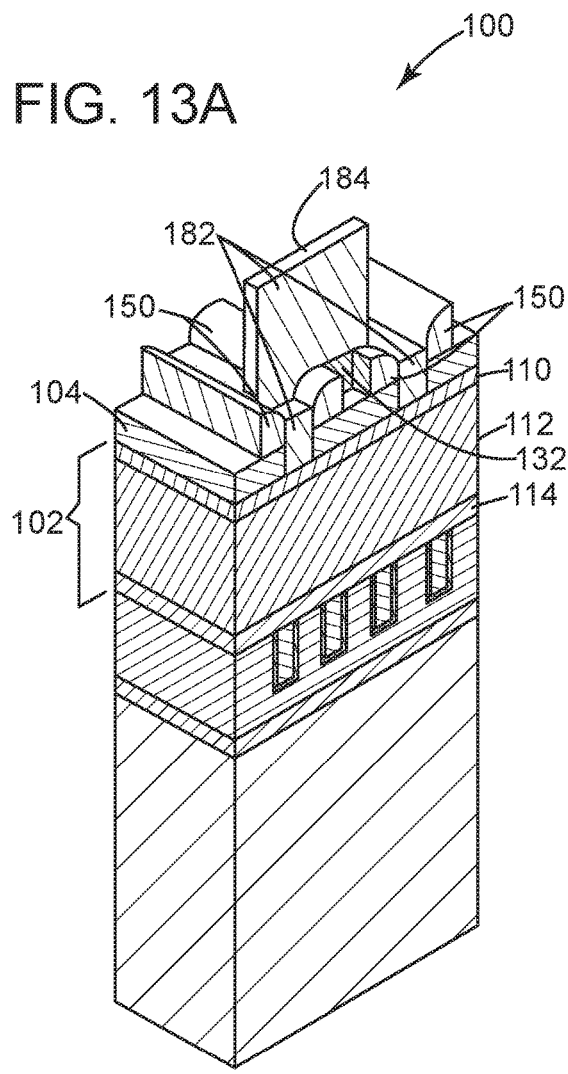
FIG. 13A is a perspective view of the structure of FIG. 12A having mandrels etched away.
Figure 13B:
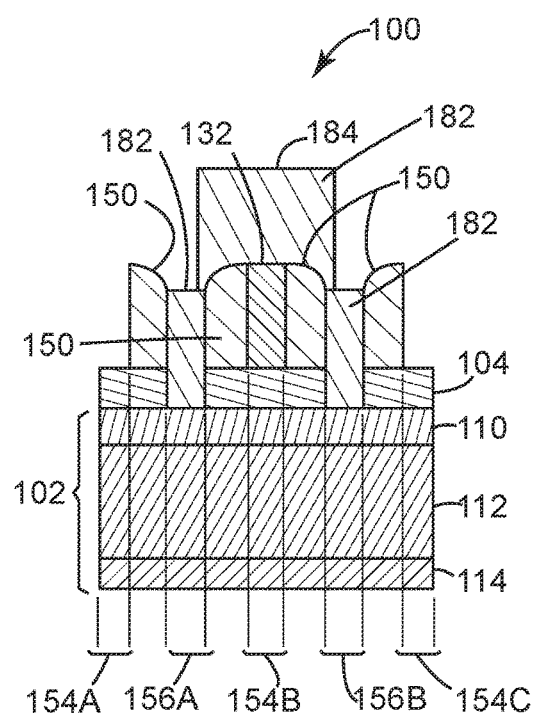
FIG. 13B is a side view of FIG. 13A.

Referring to FIGS. 13A and 13B, once the beat pillar 184 is etched into the SOH layer 182, the exposed a-Si mandrels 132 in beta regions 154A and 154C are selectively etched away. The gamma regions 156A, 156B and beta region 154B are protected from the etch process by the SOH layer 182.

Figure 14A:
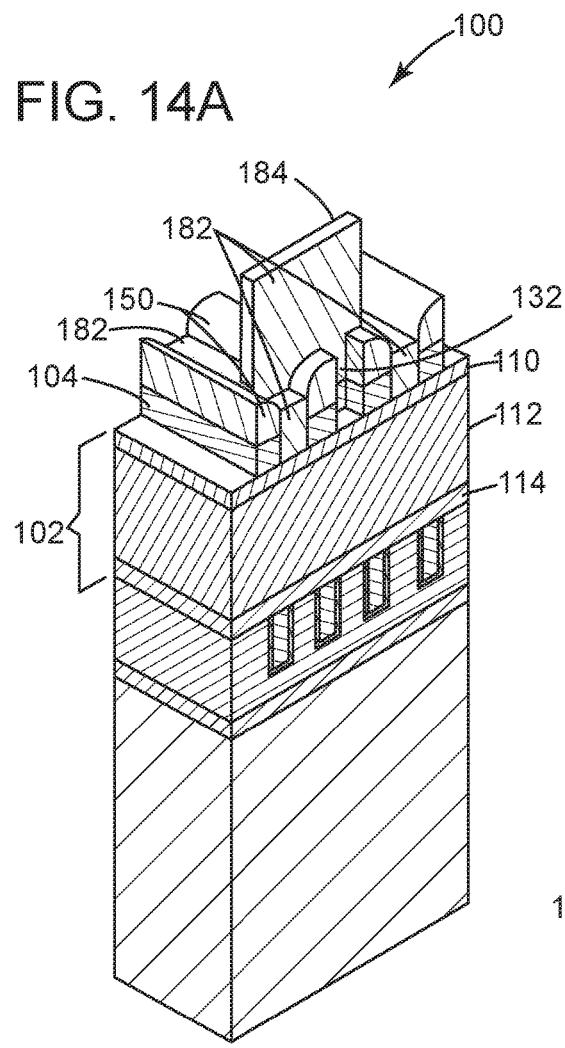
FIG. 14A is a perspective view of the structure of FIG. 13A having the exposed pattern layer in beta regions etched away.
Figure 14B:
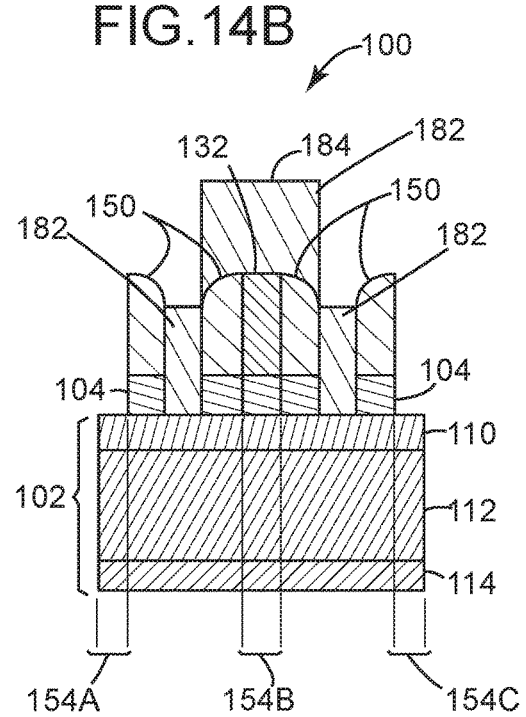
FIG. 14B is a side view of FIG. 14A.

Referring to FIGS. 14A and 14B, once the mandrels 132 in the beta regions 154A and 154C have been etched away, the portions of the TiN pattern layer 104 in the beta regions 154A, 154B and 154C not covered by the beta pillar 184 are anisotropically etched away. This exposes the beta interconnect line locations 140 of pattern 136 (best seen in FIG. 4).

Figure 15A:
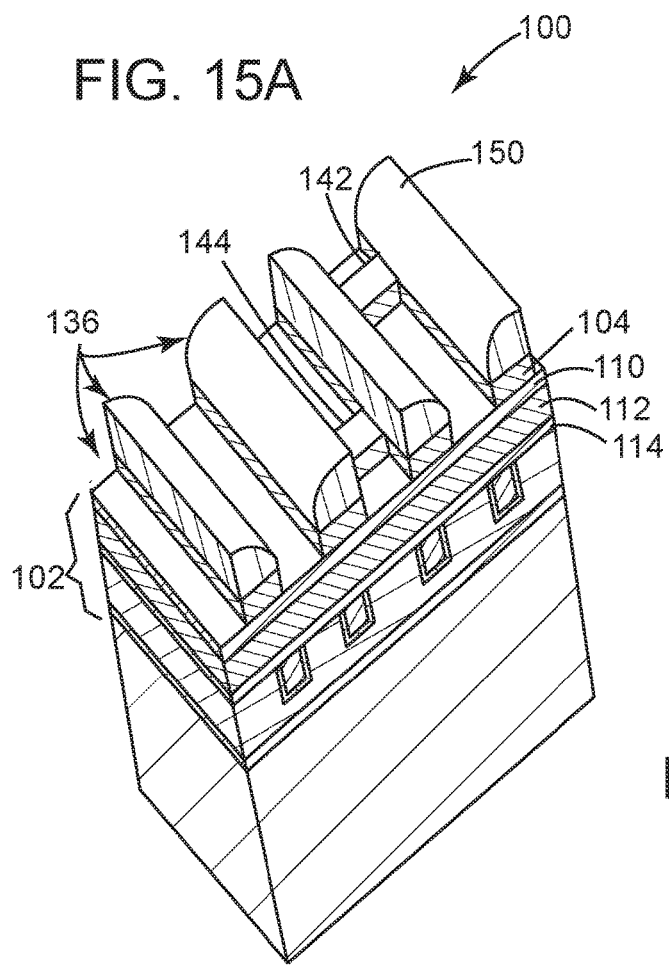
FIG. 15A is a perspective view of the structure of FIG. 14A having the beta pillar mask removed to expose a pattern in accordance with the present invention.
Figure 15B:
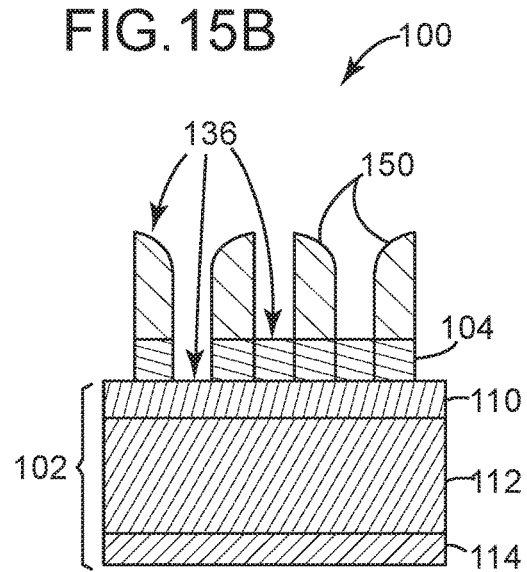
FIG. 15B is a side view of FIG. 15A.

Referring to FIGS. 15A and 15B, the beta pillar 184 and remaining portions of the SOH layer 182 are etched away. This exposed the full pattern 136 in the pattern layer 104.

At this point in the process we are ready to etch the pattern 136 to form beta and gamma line trenches in the beta and gamma regions 154, 156 respectively of the ULK layer 112 in the dielectric stack 102. Additionally a beta dielectric block will be formed across a beta line trench from the beta block mask portion 144 of the pattern 136. Further a gamma dielectric block will be formed across a gamma line trench from the gamma block mask portion 142 of the pattern 136.

Figure 16:
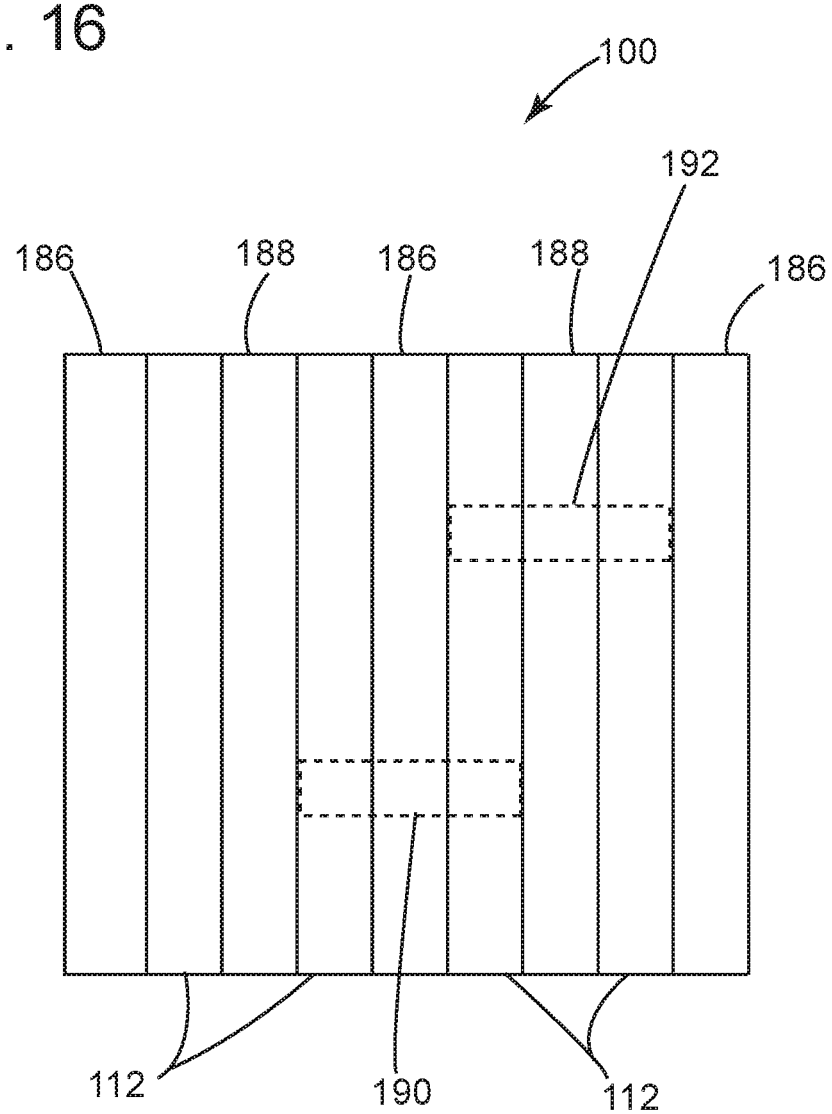
FIG. 16 is a top view of the structure of FIG. 15A having beta and gamma interconnect lines disposed in the dielectric stack in accordance with the present invention.

Referring to FIG. 16, after formation of the trenches, metal will be dispose in the gamma and beta line trenches of the ULK layer 112 to form an array of alternating parallel beta interconnect lines 186 and gamma interconnect lines 188 having a pitch between lines of 40 nm. A beta dielectric block 190 (formed from beta block mask portion 144) will extend across a beta interconnect line 186 without extending into a gamma interconnect line 188 and a gamma dielectric block 192 (formed from gamma block mask portion 142) will extend across a gamma interconnect line 188 without extending into a beta interconnect line 186.

Because the limits of the beta and gamma dielectric blocks 190 and 192 are defined by the mandrels 132 and spacers 150 which frame them, the dielectric blocks 190, 192 can be considered to be self-aligned. That is, the spacers 150 which frame the mandrels 132 in the beta regions 154A, 154B, 154C provide hard stops for the beta dielectric block 190. Additionally, the spacers 150 which frame the boundaries of the gamma regions 156A and 156B also provide hard stops for the gamma dielectric block 192.

Though this example shows a mandrel pitch of 80 nm and a spacer pitch of 40 nm, one skilled in the art would recognize that this method of forming a pattern may be used with other pitches. For example, the mandrel array may have a pitch of 100 nm or less, and the spacer array may have a pitch of 50 nm or less.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
    providing a structure having a first lithographic stack, a mandrel layer and a pattern layer disposed over a dielectric stack;
    patterning the structure to form mandrels in the mandrel layer;
    disposing a spacer layer over the mandrels;
    etching the spacer layer to form spacers disposed on sidewalls of the mandrels, the spacers and mandrels defining beta and gamma regions extending normally through the dielectric stack;
    etching a beta pillar mask over a beta region, the beta pillar mask not extending over any adjacent beta regions, the beta pillar mask extending over and defining a beta block mask portion of the pattern layer disposed within the beta region;
    disposing a second lithographic stack of layers over the structure, the second lithographic stack including a resist layer as a top layer and a spin-on hardmask (SOH) layer as a bottom layer;
    patterning a gamma pillar mask into the resist layer, the gamma pillar mask being disposed over a gamma region, the gamma pillar mask not extending over any adjacent gamma regions, the gamma pillar mask extending over and defining a gamma block mask portion of the pattern layer disposed within the gamma region;
    anisotropically etching the lithographic stack through the SOH layer to form the gamma pillar mask into the SOH layer and to expose portions of the pattern layer in gamma regions not covered by the gamma pillar mask;
    etching the structure to form a pattern in the pattern layer, the pattern including the gamma and beta block mask portions formed from the gamma and beta pillar masks; and
    selectively etching the exposed portions of pattern layer to form gamma interconnect line locations of the pattern.

2. The method of claim 1 comprising:
    the beta region extending through the mandrels, and
    the gamma region extending through the portions of the pattern layer which are absent any overlaying spacers and mandrels.

3. The method of claim 2 comprising:
    the beta region having a width equal to a mandrel width; and
    the gamma region having a width equal to a distance between the mandrels minus twice a spacer width.

4. The method of claim 1 comprising removing the gamma pillar mask to expose the gamma block mask portion of the pattern.

5. The method of claim 4 comprising:
    disposing a third lithographic stack of layers over the structure, the third lithographic stack including a resist layer as a top layer and a spin-on hardmask (SOH) layer as a bottom layer;
    patterning the beta pillar mask into the resist layer;

anisotropically etching the third lithographic stack through the SOH layer to form the beta pillar mask into the SOH layer, the beta pillar mask being disposed over a mandrel in a beta region, wherein the mandrel overlays the beta block mask portion of the pattern; and
anisotropically etching the SOH layer to expose a top surface of the mandrels without exposing the pattern layer in the gamma regions.

6. The method of claim 5 comprising selectively etching away the mandrels from the beta regions to expose the pattern layer in the beta regions.

7. The method of claim 6 comprising selectively etching the exposed portions of pattern layer in the beta regions to form beta interconnect line locations in the pattern.

8. The method of claim 7 comprising etching away the beta pillar mask and remaining portions of the SOH layer to expose the full pattern.

9. The method of claim 8 comprising:
etching the pattern to:
  form gamma and beta line trenches in the gamma and beta regions respectively of the dielectric stack,
  form a beta dielectric block across a beta line trench from the beta block mask portion of the pattern, and
  form a gamma dielectric block across a gamma line trench from the gamma block mask portion of the pattern; and
disposing metal in the gamma and beta line trenches to form an array of alternating parallel gamma and beta interconnection lines;
wherein the beta dielectric block extends across a beta interconnect line without extending into a gamma interconnect line and the gamma dielectric block extends across a gamma interconnect line without extending into a beta interconnect line.

10. The method of claim 1 wherein the mandrel layer, pattern layer and spacer layer are composed of different materials.

11. The method of claim 10 wherein the mandrel layer, pattern layer and spacer layer are composed of one of a titanium nitride, an amorphous silicon and a silicon oxide.

12. A method comprising:
providing a structure having a mandrel layer disposed over a pattern layer;
patterning the structure to form mandrels in the mandrel layer;
disposing a spacer layer over the mandrels;
etching the spacer layer to form spacers disposed on sidewalls of the mandrels, the spacers and mandrels defining alternating beta and gamma regions extending normally through the pattern layer;
etching a beta pillar mask over a beta region, the beta pillar mask not extending over any adjacent beta regions, the beta pillar mask extending over and defining a beta block mask portion of the pattern layer disposed within the beta region;
disposing a second lithographic stack of layers over the structure, the second lithographic stack including a resist layer as a top layer and a spin-on hardmask (SOH) layer as a bottom layer;
patterning the gamma pillar mask into the resist layer, the gamma pillar mask being disposed over a gamma region, the gamma pillar mask not extending over any adjacent gamma regions, the gamma pillar mask extending over and defining a gamma block mask portion of the pattern layer disposed within the gamma region;
anisotropically etching the lithographic stack through the SOH layer to form the gamma pillar mask into the SOH layer and to expose portions of the pattern layer in gamma regions not covered by the gamma pillar mask;
etching the structure to form a pattern in the pattern layer, the pattern including the gamma and beta block mask portions formed from the gamma and beta pillar masks; and
selectively etching the exposed portions of pattern layer to form gamma interconnect line locations of the pattern.

13. The method of claim 12 comprising:
the beta region extending through the mandrels, and
the gamma region extending through the portions of the pattern layer which are absent any overlaying spacers and mandrels.

14. The method of claim 12 comprising:
removing the gamma pillar mask to expose the gamma block mask portion;
disposing a third lithographic stack of layers over the structure, the third lithographic stack including a spin-on hardmask (SOH) layer as a bottom layer;
patterning the beta pillar mask into the SOH layer, the beta pillar mask being disposed over a mandrel in a beta region, wherein the mandrel overlays the beta block mask portion of the pattern;
anisotropically etching the SOH layer to expose a top surface of the mandrels without exposing the pattern layer in the gamma regions;
selectively etching away the mandrels from the beta regions to expose the pattern layer in the beta regions;
selectively etching the exposed portions of pattern layer in the beta regions to form beta interconnect line locations in the pattern; and
etching away the beta pillar mask and remaining portions of the SOH layer to expose the full pattern.

15. The method of claim 14 comprising:
disposing the pattern layer over an ultra low dielectric constant (ULK) layer disposed therein, the gamma and beta regions extending normally through the ULK layer;
etching the pattern to:
  form gamma and beta line trenches in the gamma and beta regions respectively of the ULK layer,
  form a beta dielectric block across a beta line trench from the beta block mask portion of the pattern, and
  form a gamma dielectric block across a gamma line trench from the gamma block mask portion of the pattern; and
disposing metal in the gamma and beta line trenches to form an array of alternating parallel gamma and beta interconnection lines;
wherein the beta dielectric block extends across a beta interconnect line without extending into a gamma interconnect line and the gamma dielectric block extends across a gamma interconnect line without extending into a beta interconnect line.

* * * * *